(12) United States Patent
Wu et al.

(10) Patent No.: US 11,990,346 B2
(45) Date of Patent: May 21, 2024

(54) METHOD FOR CLEAN PROCEDURE DURING MANUFACTURING SEMICONDUCTOR DEVICE

(71) Applicant: UNITED MICROELECTRONICS CORP., Hsinchu (TW)

(72) Inventors: Chuan-Chang Wu, Kaohsiung (TW); Zhen Wu, Kaohsiung (TW); Hsuan-Hsu Chen, Tainan (TW); Chun-Lung Chen, Tainan (TW)

(73) Assignee: UNITED MICROELECTRONICS CORP, Hsinchu (TW)

( * ) Notice: Subject to any disclaimer, the term of this patent is extended or adjusted under 35 U.S.C. 154(b) by 284 days.

(21) Appl. No.: 17/391,075

(22) Filed: Aug. 2, 2021

(65) Prior Publication Data
US 2023/0007939 A1 Jan. 12, 2023

(30) Foreign Application Priority Data
Jul. 6, 2021 (CN) .......................... 202110762385.5

(51) Int. Cl.
*H01L 21/311* (2006.01)
*H01L 21/3213* (2006.01)
*H01L 29/66* (2006.01)

(52) U.S. Cl.
CPC .. *H01L 21/32134* (2013.01); *H01L 29/66545* (2013.01)

(58) Field of Classification Search
CPC . H01L 21/31111; H01L 21/31056; B08B 3/04
See application file for complete search history.

(56) References Cited

U.S. PATENT DOCUMENTS

| 9,159,582 | B2 | 10/2015 | Ouyang et al. | |
| 2015/0064928 | A1* | 3/2015 | Yu | H01L 21/6708 438/746 |
| 2017/0309520 | A1* | 10/2017 | Liou | H01L 29/66545 |
| 2020/0161186 | A1* | 5/2020 | Reboh | H01L 21/823412 |
| 2021/0265481 | A1* | 8/2021 | Huang | H01L 27/0886 |

* cited by examiner

*Primary Examiner* — Thomas T Pham
(74) *Attorney, Agent, or Firm* — WPAT, P.C

(57) ABSTRACT

A method for a clean procedure during manufacturing a semiconductor device, includes: providing a patterned sacrificial gate structure including a gate dielectric and a sacrificial layer; wherein the patterned sacrificial gate structure is embedded in a dielectric layer and an upper surface of the sacrificial layer is exposed; performing a first etching process to remove the sacrificial layer; and performing a hydrophilic treatment and a hydrophobic treatment to remove a residue of the sacrificial layer.

7 Claims, 5 Drawing Sheets

METHOD FOR CLEAN PROCEDURE DURING MANUFACTURING SEMICONDUCTOR DEVICE

This application claims the benefit of People's Republic of China application Serial No. 202110762385.5, filed Jul. 6, 2021, the subject matter of which is incorporated herein by reference.

BACKGROUND OF THE INVENTION

Field of the Invention

The invention relates in general to a method for a clean procedure, and more particularly to a method for a clean procedure during manufacturing a semiconductor device.

Description of the Related Art

Recently, the demands for a semiconductor device are increased. An etching process may be performed to remove a sacrificial layer in a patterned sacrificial gate structure in a clean procedure during manufacturing a semiconductor device. In some embodiments, the etching process has to be performed for a long time in order to completely remove a residue of the sacrificial layer, that is, the over-etching time has to be very long. However, such long over-etching time may damage the bottom layer below the sacrificial layer and cause the yield loss defect.

Therefore, it is urged to develop an improved method for a clean procedure during manufacturing a semiconductor device.

SUMMARY OF THE INVENTION

The present invention relates to a method for a clean procedure during manufacturing a semiconductor device. The defect of yield loss of semiconductor devices can be improved by a hydrophilic treatment and a hydrophobic treatment.

According to an embodiment of the present invention, a method for a clean procedure during manufacturing a semiconductor device is provided. The method includes: providing a patterned sacrificial gate structure including a gate dielectric and a sacrificial layer; wherein the patterned sacrificial gate structure is embedded in a dielectric layer and an upper surface of the sacrificial layer is exposed; performing a first etching process to remove the sacrificial layer; and performing a hydrophilic treatment and a hydrophobic treatment to remove a residue of the sacrificial layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

The present application provides a method for a clean procedure during manufacturing a semiconductor device, which can solve the problems in the loss of chip yield caused by over-etching for too long in the prior art. In order to make the objectives, features, and advantages of the present invention more comprehensible, one embodiment is provided below, and is described in detail in conjunction with the accompanying drawings.

However, it must be noted that the specific embodiment and method are not intended to limit the present invention. The present invention can still be implemented using other features, elements, methods, and parameters. The preferred embodiments are only used to illustrate the technical features of the present invention, and not to limit the scope of the claims of the present invention. One of ordinary skill in the art will be able to make equivalent modifications and changes based on the description in the following specification without departing from the spirit of the present invention.

Figure 1:
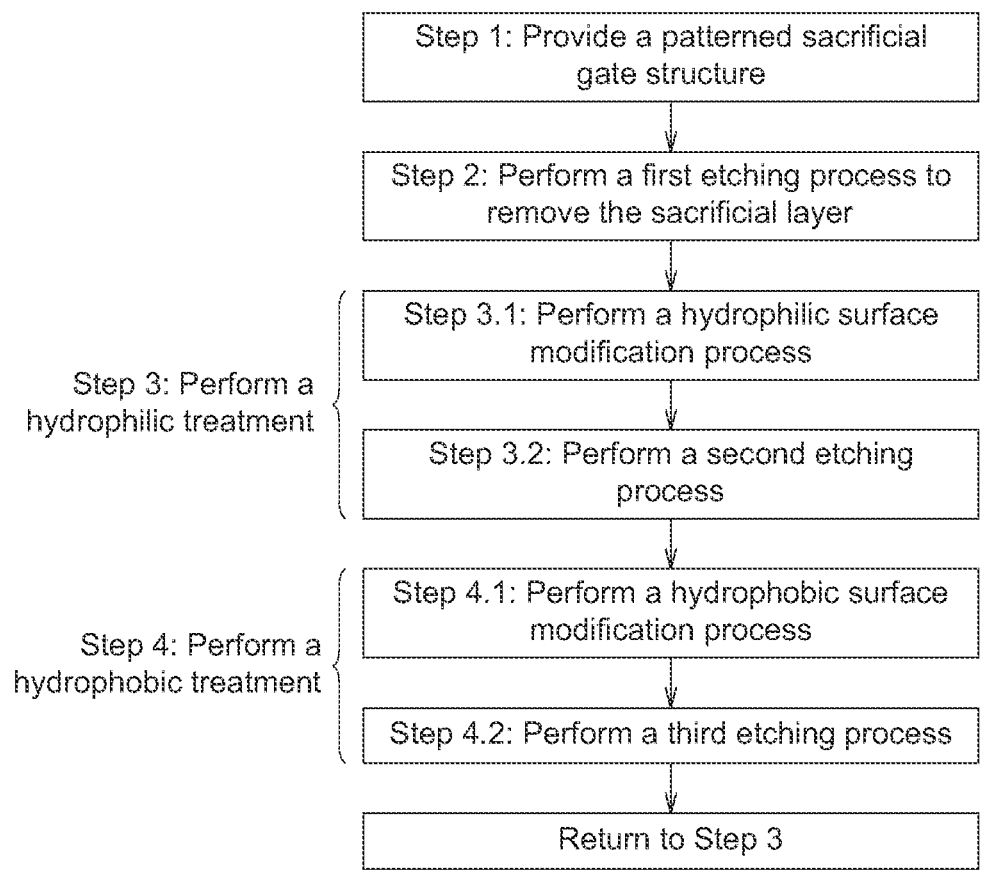
FIG. 1 illustrates a method for a clean procedure during manufacturing a semiconductor device according to an embodiment of the present invention.

FIG. 1 illustrates a method for a clean procedure during manufacturing a semiconductor device according to an embodiment of the present invention. FIGS. 2A to 2F illustrate partial schematic diagrams of a clean procedure during manufacturing a semiconductor device according to an embodiment of the present invention. FIGS. 3A to 3C illustrate the relationship between bubbles and surfaces with different properties.

Figure 2A:
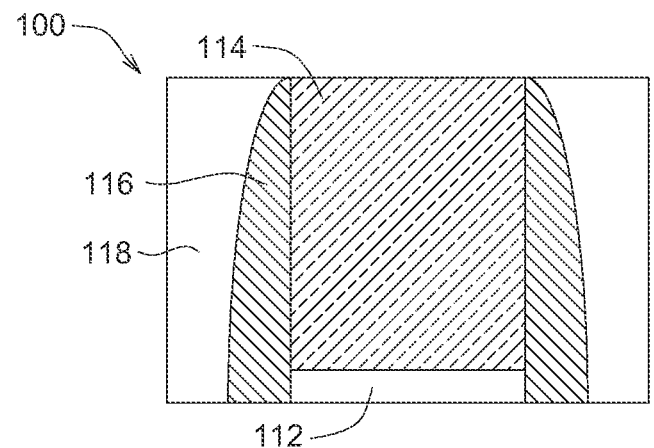
FIGS. 2A to 2F illustrate partial schematic diagrams of a clean procedure during manufacturing a semiconductor device according to an embodiment of the present invention.
Figure 3A:
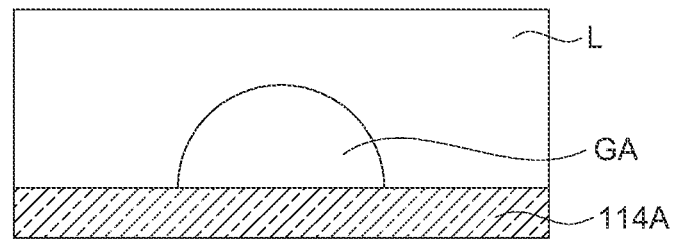
FIGS. 3A to 3C illustrate the relationship between bubbles and surfaces with different properties.
Figure 3B:
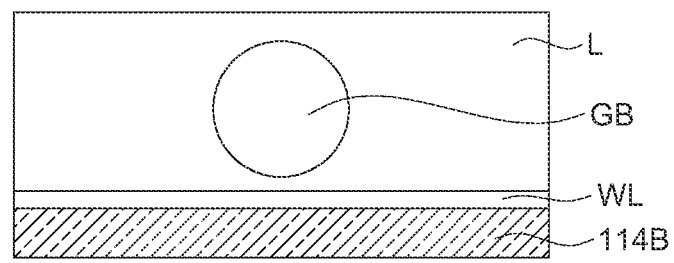
Figure 3C:
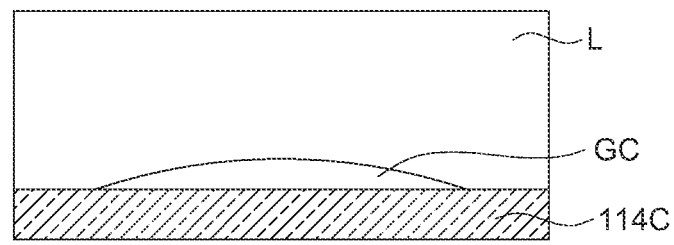

Referring to FIG. 1 and FIG. 2A at the same time, in Step 1, a patterned sacrificial gate structure 100 is provided. The patterned sacrificial gate structure 100 includes a gate dielectric 112 and a sacrificial layer 114, wherein the patterned sacrificial gate structure 100 is embedded in a dielectric layer 118 and the upper surface of the sacrificial layer 114 is exposed. A pair of spacers 116 can be formed on the two sidewalls of the patterned sacrificial gate structure 100. The material of the gate dielectric 112 may be an oxide, such as silicon dioxide. The material of the sacrificial layer 114 may include silicon, such as polysilicon.

Figure 2B:
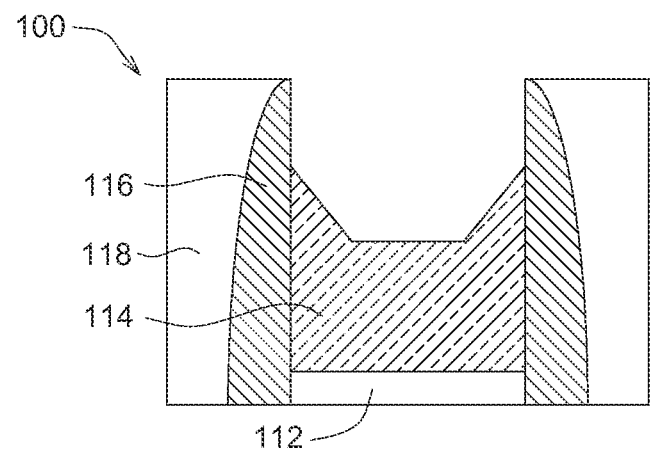
Figure 2C:
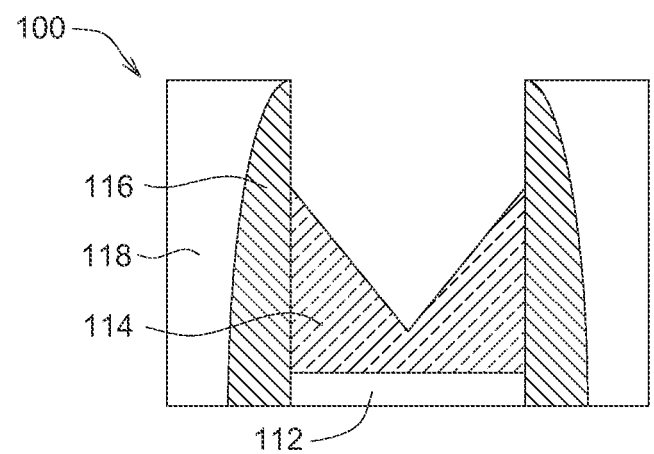

Next, referring to FIGS. 1 and 2B-2C at the same time, in Step 2, a first etching process is performed to remove the sacrificial layer 114. The first etching process is, for example, a wet etching process, and an etchant used in the wet etching process may be an alkaline etchant, such as ammonium hydroxide ($NH_4OH$) or tetramethylammonium hydroxide (TMAH). In some embodiments, a pre-treatment may be performed before the first etching process. The pre-treatment may include applying an acid etchant (for example, hydrofluoric acid, HF) to remove the native oxide on the surface of the sacrificial layer 114.

Gas is usually generated during the first etching process (for example, wet etching process), and the gas forms bubbles (for example, bubbles of hydrogen gas) in the etchant. As shown in FIG. 2B, when the bottom of the etching opening of the sacrificial layer 114 is flat, the bubbles easily escape. However, when the bottom of the etching opening of the sacrificial layer 114 is narrow, the bubbles are not easy to escape, so that the etching process is blocked by the bubbles and cannot continue to react, as shown in FIG. 2C. In the traditional cleaning process, in order to solve the problem of bubbles blocking the etching, the wet etching time is usually extended, and the remaining sacrificial layer is removed by the extension of the over-etching time. However, if the over-etching time is too long, it may damage the bottom layer (such as the gate dielectric and/or other layers) under the sacrificial layer, which may result in increased chip yield loss.

Figure 2D:
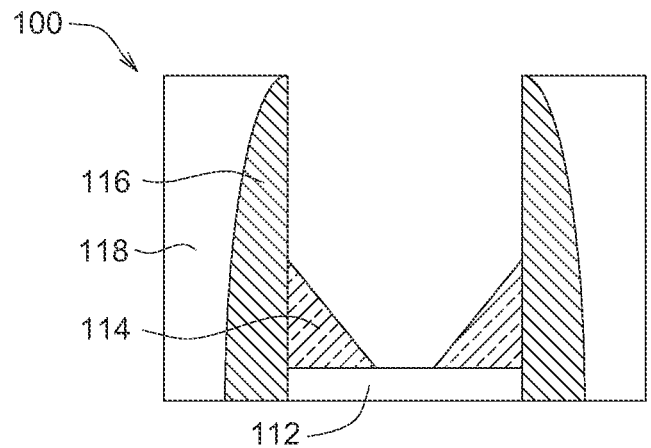

In contrast, the present invention provides a clean process that can improve the above-mentioned problems. Referring to FIGS. 1 and 2D at the same time, after performing the first etching process, Step 3 and Step 4 are performed, that is, a hydrophilic treatment and a hydrophobic treatment are performed to remove the remaining portion of the sacrificial layer 114. In the present embodiment, the hydrophilic treatment in Step 3 is performed before the hydrophobic treatment in Step 4 is performed. However, the present invention is not limited thereto, and the order of the hydrophilic treatment and the hydrophobic treatment can be interchanged.

In one embodiment, the hydrophilic treatment includes a hydrophilic surface modification process (i.e., Step 3.1) and a second etching process (that is, Step 3.2), and the hydrophobic treatment includes a hydrophobic surface modification process (i.e., Step 4.1) and a third etching process (i.e., Step 4.2). Furthermore, the hydrophilic surface modification process includes the use of an acidic oxidant, such as sulfuric acid-hydrogen peroxide mixture (SPM), hydrochloric acid-hydrogen peroxide mixture (HPM) or other suitable acidic oxidants. The hydrophobic surface modification process includes the use of a fluorinated acid. The fluorinated acid is, for example, hydrofluoric acid (HF). The second etching process and the third etching process are respectively, for example, a wet etching process, and the etchant used in the wet etching process may be an alkaline etchant, such as ammonium hydroxide or tetramethylammonium hydroxide. For example, the first etching process, the second etching process, and the third etching process have the same etching time, but the present invention is not limited thereto.

As shown in FIG. 3A, in the comparative example where the remaining portion of the sacrificial layer 114A has not undergone the surface modification process, the bubbles GA need to overcome the contact angle hysteresis to move in the liquid L (for example, an etchant or pure water), because the bubbles GA are small, the generated buoyancy is not enough to overcome the contact angle hysteresis, so the bubbles GA are easily adsorbed on the surface of the sacrificial layer 114A (the bubbles GA have a cross-section similar to a semicircle, for example). This causes the bubbles GA to easily block the etching process. Compared with the comparative example in FIG. 3A, as shown in FIG. 3B, in the hydrophilic surface modification process (for example, Step 3.1), the surface properties of the sacrificial layer 114B are hydrophilic, so the direction of surface tension is changed, and the liquid L (for example, an etchant or pure water) will approach the surface of the sacrificial layer 114B to form an isolation layer WL between the bubbles GB and the sacrificial layer 114B, which separates the bubbles GB from the sacrificial layer 114B, so that the bubbles GB are less likely to contact the sacrificial layer 114B, in this way, the bubbles GB can be prevented from being adsorbed on the surface of the sacrificial layer 114B, and the chance of the bubbles GB blocking the etching process is reduced. The bubbles GB have a circular cross-section, for example. Compared with the comparative example of FIG. 3A, as shown in FIG. 3C, in the hydrophobic surface modification process (for example, Step 4.1), the surface property of the sacrificial layer 114C is hydrophobic, so the bubbles GC in the liquid L (for example, the etchant or pure water) can have lower hysteresis and lower drag force. The bubbles GC have a streamline-like profile, which can improve the mobility of the bubbles GC on the surface of the sacrificial layer 114C. Therefore, it can facilitate the sliding of the bubbles GC and improve the circumstance that the etching process is blocked by the bubbles GC.

In one embodiment, the hydrophobic treatment and the hydrophilic treatment can be used as a cycle. In the clean process of the present invention, the hydrophobic treatment and the hydrophilic treatment can be performed for at least two cycles, and the number of cycles can be adjusted according to requirements.

Figure 2E:
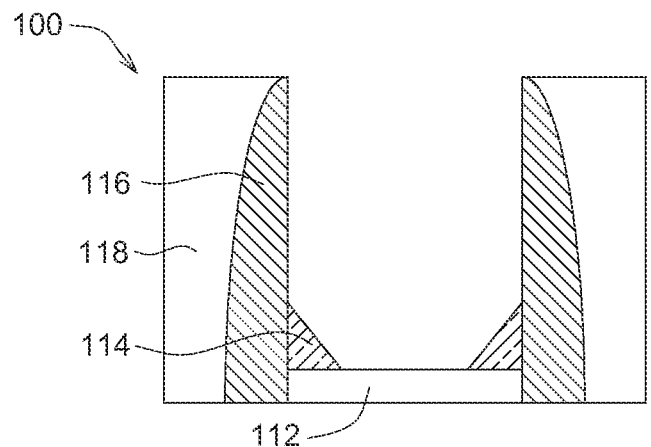
Figure 2F:
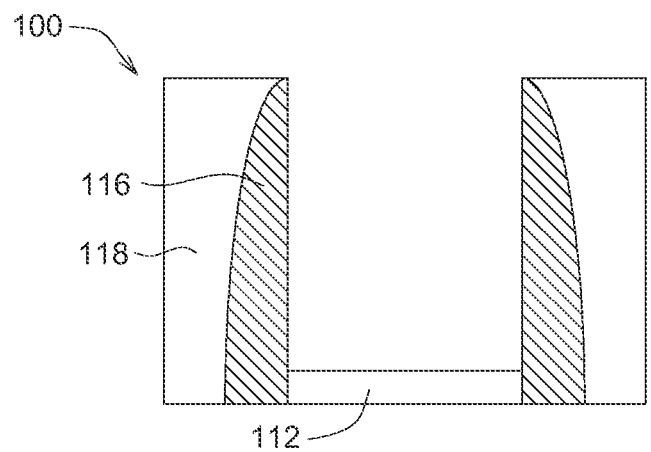

In one embodiment, the hydrophilic treatment can be repeated to perform a plurality of hydrophilic treatments, and the hydrophobic treatment can be repeated to perform a plurality of hydrophobic treatments, wherein the hydrophilic treatments and the hydrophobic treatments may be alternately performed. The number of repetitions can be adjusted according to requirements. For example, referring to FIGS. 1 and 2D-2F, after performing the Step 4, it may be returned to Step 3, and the hydrophilic treatment of Step 3 and the hydrophobic treatment of Step 4 may be repeated for several times, such that most portions of the sacrificial layer 114 may be removed under the circumstances less impacted by bubbles. In some embodiments, there may be tiny portions of the sacrificial layer 114 at the corners, as shown in FIG. 2E. Referring to FIG. 2F, the sacrificial layer 114 at the corners can be completely removed by the third etching process, which can well protect the gate dielectric 112, and will not damage the layer under the gate dielectric 12.

According to one embodiment, deionized water can be used for cleaning between different processes. After the sacrificial layer 114 is completely removed, the spin-drying can be used to dry the semi-finished product of the semiconductor device to perform the subsequent processes (for example, forming a gate electrode or other processes).

The method for a clean process during manufacturing a semiconductor device as shown in FIGS. 1 and 2A-2F can be applied to the dummy poly removal, but the present invention is not limited thereto. The method for a clean process during manufacturing a semiconductor device of the present invention can be applied to other processes, such as the amorphous silicon removal (ASI-removal) or other appropriate processes, such as any process that needs to improve the etching reaction blocked by the gas.

Figure 4A:
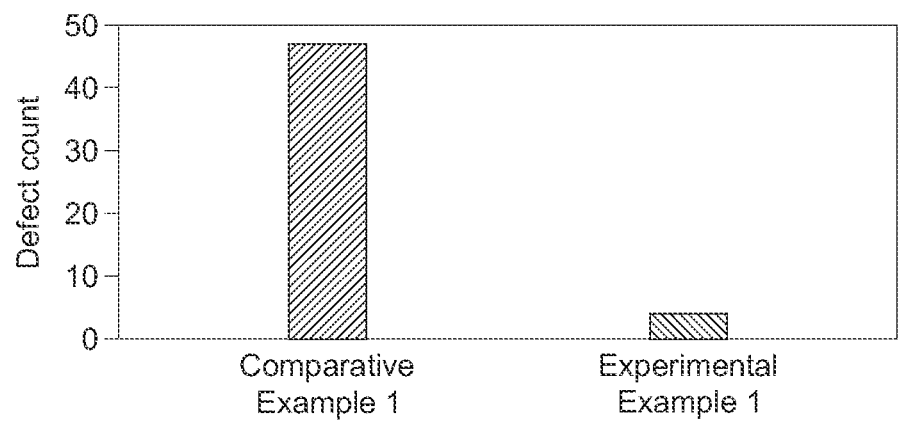
FIG. 4A illustrates a schematic diagram showing the defect count of Comparative Example 1 and Experimental Example 1.
Figure 4B:
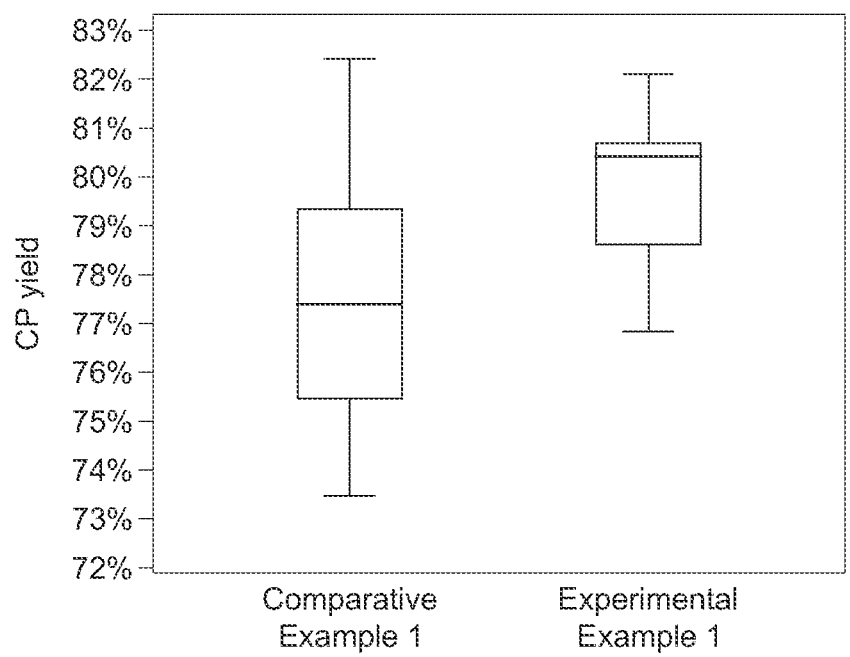
FIG. 4B illustrates a schematic diagram of the chip yield of Comparative Example 1 and Experimental Example 1.

FIG. 4A illustrates a schematic diagram showing the defect count of Comparative Example 1 and Experimental Example 1. FIG. 4B shows a schematic diagram of the chip yield (CP yield) of Comparative Example 1 and Experimental Example 1.

The Comparative Example 1 indicates the traditional clean procedure in which the time of the etching process is increased to completely remove the sacrificial layer, and the hydrophilic treatment and the hydrophobic treatment shown in the present invention are not performed. The Experimental Example 1 indicates the clean procedure of the present invention (as shown in FIGS. 1 and 2A-2E) which includes multiple hydrophilic treatments and hydrophobic treatments to completely remove the sacrificial layer.

Referring to FIG. 4A, the X-axis indicates the group of Comparative Example 1 and Experimental Example 1, and the Y-axis indicates the number of defects. According to the results, the number of defects in Comparative Example 1 is as high as 47; the number of defects in Experimental Example 1 is only 4. It is apparent that the method for a clean procedure during manufacturing a semiconductor device according to the present application can significantly reduce the number of defects.

Referring to FIG. 4B, the X-axis indicates the group of Comparative Example 1 and Experimental Example 1, and the Y-axis indicates the chip yield (CP yield). According to the results, the CP yield of Comparative Example 1 is only 77.4%; the CP yield of Experimental Example 1 is 79.3%, which increases 1.9% in comparison with Comparative Example 1. It is apparent that the method for a clean procedure during manufacturing a semiconductor device according to the present application can increase the CP yield.

According to the above-mentioned embodiment, the present invention provides a method for a clean procedure during manufacturing a semiconductor device. The method includes: providing a patterned sacrificial gate structure including a gate dielectric and a sacrificial layer; wherein the patterned sacrificial gate structure is embedded in a dielectric layer and an upper surface of the sacrificial layer is exposed; performing a first etching process to remove the sacrificial layer; and performing a hydrophilic treatment and a hydrophobic treatment to remove a residue of the sacrificial layer.

Compared with the comparative example in which the clean process is performed without the hydrophilic treatment and the hydrophobic treatment (which removes the residue of the sacrificial layer simply by using over-etching), since the method for a clean procedure during manufacturing a semiconductor device of the present invention includes performing the hydrophilic treatment and the hydrophobic treatment, it can accelerate discharging the bubbles generated in the manufacturing process and prevent the bubbles from blocking the etching process. The time required for the over-etching to completely remove the sacrificial layer may be reduced, so it can not only reduce the time and cost required for removing the sacrificial layer, but also can prevent the problem that the bottom layer under the sacrificial layer may be damaged due to over-etching for too long, so that the occurrence of defects can be improved, and the CP yield can be increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for a clean procedure during manufacturing a semiconductor device, comprising:
    providing a patterned sacrificial gate structure comprising a gate dielectric and a sacrificial layer; wherein the patterned sacrificial gate structure is embedded in a dielectric layer and an upper surface of the sacrificial layer is exposed;
    removing the sacrificial layer by performing a first etching process without etching the gate dielectric; and
    removing a residue of the sacrificial layer by performing a hydrophilic treatment and a hydrophobic treatment,
    wherein the hydrophilic treatment comprises a hydrophilic surface modification process, and the hydrophobic treatment comprises a hydrophobic surface modification process;
    wherein the hydrophilic surface modification process comprises using an acidic oxidant, and the hydrophobic surface modification process comprises using a fluorinated acid;
    wherein the hydrophilic treatment and the hydrophobic treatment are performed for at least 2 cycles.

2. The method according to claim 1, wherein a pair of spacers are formed on two sidewalls of the patterned sacrificial gate structure.

3. The method according to claim 1, wherein the hydrophilic treatment comprises a second etching process, and the hydrophobic treatment comprises and a third etching process.

4. The method according to claim 1, further comprising:
    repeating the hydrophilic treatment to perform a plurality of hydrophilic treatments;
    repeating the hydrophobic treatment to perform a plurality of hydrophobic treatments;
    wherein the hydrophilic treatments and the hydrophobic treatments are performed alternately.

5. The method according to claim 1, wherein a material of the sacrificial layer comprises silicon.

6. The method according to claim 1, wherein the first etching process is a wet etching process.

7. The method according to claim 6, wherein an etchant used in the wet etching process is ammonium hydroxide or tetramethylammonium hydroxide.

* * * * *